(12) United States Patent
Kim

(10) Patent No.: US 10,510,303 B2
(45) Date of Patent: Dec. 17, 2019

(54) CURRENT SENSOR AND ORGANIC LIGHT EMITTING DISPLAY DEVICE INCLUDING THE SAME

(71) Applicant: Samsung Display Co., Ltd., Yongin-si, Gyeonggi-do (KR)

(72) Inventor: Jin Woo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/162,282

(22) Filed: Oct. 16, 2018

(65) Prior Publication Data

US 2019/0088210 A1    Mar. 21, 2019

Related U.S. Application Data

(62) Division of application No. 15/183,644, filed on Jun. 15, 2016, now Pat. No. 10,140,929.

(30) Foreign Application Priority Data

Jul. 6, 2015   (KR) .................. 10-2015-0095944

(51) Int. Cl.
 *G09G 3/3283* (2016.01)
 *G01R 15/09* (2006.01)
 *G01R 19/00* (2006.01)

(52) U.S. Cl.
 CPC .......... *G09G 3/3283* (2013.01); *G01R 15/09* (2013.01); *G01R 19/0092* (2013.01); *G09G 2300/0426* (2013.01); *G09G 2300/0809* (2013.01); *G09G 2330/04* (2013.01)

(58) Field of Classification Search
 None
 See application file for complete search history.

(56) References Cited

U.S. PATENT DOCUMENTS

| 5,965,986 A | 10/1999 | Borho et al. |
| 6,456,087 B1 | 9/2002 | Kamitani |
| 2004/0131329 A1 | 7/2004 | Ogawa |
| 2006/0109214 A1 | 5/2006 | Cho et al. |
| 2010/0277513 A1 | 11/2010 | Byun |
| 2014/0097685 A1 | 4/2014 | Jun et al. |
| 2014/0247023 A1 | 9/2014 | Kippley et al. |
| 2014/0312787 A1 | 10/2014 | Van Den Broeke |

FOREIGN PATENT DOCUMENTS

| KR | 10-1999-0008071 A | 1/1999 |
| KR | 10-2006-0058227 A | 5/2006 |
| KR | 10-2014-0041357 A | 4/2014 |
| KR | 10-2014-0071825 A | 6/2014 |

*Primary Examiner* — Sepehr Azari
(74) *Attorney, Agent, or Firm* — Lewis Roca Rothgerber Christie LLP

(57) ABSTRACT

A current sensor includes a first resistor between a first node and a second node, a first voltage limiting device between the first node and the second node, and a second resistor between the second node and a third node, wherein a resistance level of the first resistor is greater than a resistance level of the second resistor, and wherein a current flowing from the third node to the first node is configured to be measured based on a voltage across the first resistor or a voltage across the second resistor.

5 Claims, 7 Drawing Sheets

CURRENT SENSOR AND ORGANIC LIGHT EMITTING DISPLAY DEVICE INCLUDING THE SAME

CROSS-REFERENCE TO RELATED APPLICATION(S)

The subject application is a divisional application of U.S. patent application Ser. No. 15/183,644, filed Jun. 15, 2016 which claims priority to, and the benefit of, Korean Patent Application No. 10-2015-0095944, filed on Jul. 6, 2015, in the Korean Intellectual Property Office, the entire contents of which are incorporated herein by reference in their entirety.

BACKGROUND

1. Field

Embodiments of the present invention relate to a current sensor, and an organic light emitting display device including the same.

2. Description of the Related Art

Various types of display devices, which may have reduced weight and volume when compared to the cathode ray tube (CRT), are currently under development. These display devices may include, for example, a liquid crystal display, a field emission display, a plasma display panel, and an organic light emitting display device.

An organic light emitting display device may include a power supply and a panel. Pixels in the panel may receive current from the power supply to emit light. A current level of the current supplied from the power supply to the panel of the organic light emitting device may be measured.

The current level of the current supplied from the power supply in the organic light emitting display device to the display panel of the organic light emitting display device may vary depending on whether each of the pixels emits light, and depending on a brightness of the emitted light.

SUMMARY

Embodiments of the present invention are directed toward a current sensor capable of measuring a current level in a wide range, despite the omission of a separate driving signal having a logic value that is determined based on whether there is provided a predicted current level that is greater than a reference level, and an organic light emitting display device including the same.

In addition, embodiments of the present invention provide a reduced current sensor that does not perform an erroneous operation due to the current sensor failing to receive a driving signal, and is therefore not damaged by the erroneous operation, and a light emitting display device including the same.

According to an embodiment of the present invention, there is provided a current sensor including a first resistor between a first node and a second node, a first voltage limiting device between the first node and the second node, and a second resistor between the second node and a third node, wherein a resistance level of the first resistor is greater than a resistance level of the second resistor, and wherein a current flowing from the third node to the first node is configured to be measured based on a voltage across the first resistor or a voltage across the second resistor.

The first voltage limiting device may include a Schottky diode or a diode-connected power transistor, current may flow from the second node to the first node through substantially only the first resistor when the voltage across the first resistor is less than a threshold voltage of the first voltage limiting device, and current may flow from the second node to the first node through the first voltage limiting device when the voltage across the first resistor is greater than or equal to the threshold voltage of the first voltage limiting device.

The current flowing from the third node to the first node may be configured to be measured based on the voltage across the first resistor or the voltage across the second resistor when the voltage across the first resistor is less than the threshold voltage of the first voltage limiting device, and based on the voltage across the second resistor when the voltage across the first resistor is greater than or equal to the threshold voltage of the first voltage limiting device.

The current sensor may further include a first analog-to-digital converter that is configured to convert the voltage across the first resistor to output a first digital value, and a second analog-to-digital converter that is configured to convert the voltage across the second resistor to output a second digital value.

The current sensor may further include a second voltage limiting device between the second node and the third node, and a third resistor electrically the third node and a fourth node, a resistance level of the third resistor may be less than the resistance level of the second resistor, and a current flowing from the fourth node to the first node may be configured to be measured based on the voltage across the first resistor, the voltage across the second resistor, or a voltage across the third resistor.

The second voltage limiting device may include a Schottky diode or a diode-connected power transistor, current may flow from the third node to the second node through substantially only the second resistor when the voltage across the second resistor is less than a threshold voltage of the second voltage limiting device, and current may flow through the second voltage limiting device when the voltage across the second resistor is greater than or equal to the threshold voltage of the second voltage limiting device.

The current flowing from the fourth node to the first node may be configured to be measured based on the voltage across the first resistor, the voltage across the second resistor, or the voltage across the third resistor when the voltage across the first resistor is less than the threshold voltage of the first voltage limiting device, and when the voltage across the second resistor is less than the threshold voltage of the second voltage limiting device, the current flowing from the fourth node to the first node may be configured to be measured based on the voltage across the second resistor or the voltage across the third resistor when the voltage across the first resistor is greater than or equal to the threshold voltage of the first voltage limiting device, and when the voltage across the second resistor is less than the threshold voltage of the second voltage limiting device, and the current flowing from the fourth node to the first node may be configured to be measured based on the voltage across the third resistor when the voltage across the first resistor is greater than or equal to the threshold voltage of the first voltage limiting device, and the voltage across the second resistor is greater than or equal to the threshold voltage of the second voltage limiting device.

The current sensor may further include a first analog-to-digital converter that is configured to convert the voltage across the first resistor to output a first digital value, a second analog-to-digital converter that is configured to convert the voltage across the second resistor to output a second digital value, and a third analog-to-digital converter that is configured to convert the voltage across the third resistor to output a third digital value.

The current sensor may further include a transistor that is configured to output a first selection signal having a first logic value when the voltage across the first resistor is less than a threshold voltage of the transistor, and the first selection signal having a second logic value that is different from the first logic value when the voltage across the first resistor is greater than or equal to the threshold voltage of the transistor.

According to another embodiment of the present invention, there is provided an organic light emitting display device including a display panel including pixels, power supply lines configured to transfer power to the pixels, data lines configured to transfer data voltages to the pixels, and scan lines configured to transfer scan signals to the pixels, a display panel driver configured to drive the display panel by generating and providing the data voltages to the data lines, and by generating and providing the scan signals to the scan lines, a power supply configured to generate and supply the power to the power supply lines, and a current sensor configured to measure a current level of the power, the current sensor including a first resistor between a first node a second node, a first voltage limiting device between the first node and the second node, and a second resistor between the second node and a third node, wherein a resistance level of the first resistor is greater than a resistance level of the second resistor, and wherein a current flowing from the third node to the first node is configured to be measured based on a voltage across the first resistor or a voltage across the second resistor.

The current flowing from the third node to the first node may correspond to the current level of the power, and the organic light emitting display device may further include a microcontroller that is configured to generate a panel signal including information about the display panel based on the current level of the power, generate the panel signal based on the voltage across the first resistor or the voltage across the second resistor, and transfer at least part of the panel signal to the display panel driver or the power supply.

The current sensor may further include a first analog-to-digital converter that is configured to convert the voltage across the first resistor to output a first digital value, and a second analog-to-digital converter that is configured to convert the voltage across the second resistor to output a second digital value, and the microcontroller may include a selector configured to output the first digital value or the second digital value as a final digital value based on a first selection signal, a current level calculator configured to output a current digital value based on the final digital value and the first selection signal, and a panel signal generator configured to generate the panel signal based on the current digital value.

The microcontroller may further include a selection signal generator configured to output the first selection signal having a first logic value when the first digital value is equal to or less than a first reference level, and output the first selection signal having a second logic value different from the first logic value when the first digital value is greater than the first reference level, and the selector may be configured to output the first digital value as the final digital value when the first selection signal having the first logic value is received, and output the second digital value as the final digital value when the first selection signal having the second logic value is received.

The current sensor may further include a transistor, a difference in voltage level between a gate electrode and a source electrode of the transistor may correspond to the voltage across the first resistor, the current sensor may be configured to output the first selection signal having a first logic value when the difference in voltage level between the gate electrode and the source electrode of the transistor is less than a threshold voltage of the transistor, and output the first selection signal having a second logic value that is different from the first logic value when the difference in voltage level between the gate electrode and the source electrode of the transistor is greater than or equal to the threshold voltage of the transistor, and the selector may be configured to output the first digital value as the final digital value when the first selection signal having the first logic value is received, and output the second digital value as the final digital value when the first selection signal having the second logic value is received.

The panel signal may include a deterioration signal, a distribution signal, and a current level signal.

The current sensor may further include a second voltage limiting device between the second node and the third node, and a third resistor between the third node and a fourth node, a resistance level of the third resistor may be less than a resistance level of the second resistor, and a current flowing from the fourth node to the first node may be configured to be measured based on the voltage across the first resistor, the voltage across the second resistor, or a voltage across the third resistor.

The current flowing from the fourth node to the first node may correspond to the current level of the power, the organic light emitting display device may further include a microcontroller that is configured to generate a panel signal including information about the display panel based on the current level of the power, generate the panel signal based on the voltage across the first resistor, the voltage across the second resistor, or the voltage across the third resistor, and transfer at least part of the panel signal to the display panel driver or the power supply.

The current sensor may further include a first analog-to-digital converter that is configured to convert the voltage across the first resistor to output a first digital value, a second analog-to-digital converter that is configured to convert the voltage across the second resistor to output a second digital value, and a third analog-to-digital converter that is configured to convert the voltage across the third resistor to output a third digital value, the microcontroller may include a selection signal generator configured to output a first selection signal based on the first digital value, and output a second selection signal based on the second digital value, a selector configured to output one of the first, second, or third digital values as a final digital value based on logic values of the first selection signal and the second selection signal, a current level calculator configured to output a current digital value based on the final digital value, the first selection signal, or the second selection signal, and a panel signal generator configured to generate the panel signal based on the current digital value.

The selection signal generator may be configured to output the first selection signal having a first logic value when the first digital value is equal to or less than a first reference level, output the first selection signal having a second logic value different from the first logic value when the first digital value is greater than the first reference level, output the second selection signal having the first logic value when the second digital value is equal to or less than a second reference level, and output the second selection signal having the second logic value when the second digital value is greater than the second reference level, and the selector may be configured to output the first digital value as the final digital value when the first selection signal having the first logic value is received, and when the second selection signal having the first logic value is received, and to output the second digital value as the final digital value when the first selection signal having the second logic value is received, and when the second selection signal having the first logic value is received, and to output the third digital value as the final digital value when receiving the second selection signal having the second logic value.

BRIEF DESCRIPTION OF THE DRAWINGS

Example embodiments will now be described more fully hereinafter with reference to the accompanying drawings, in which.

DETAILED DESCRIPTION

Figure 1:
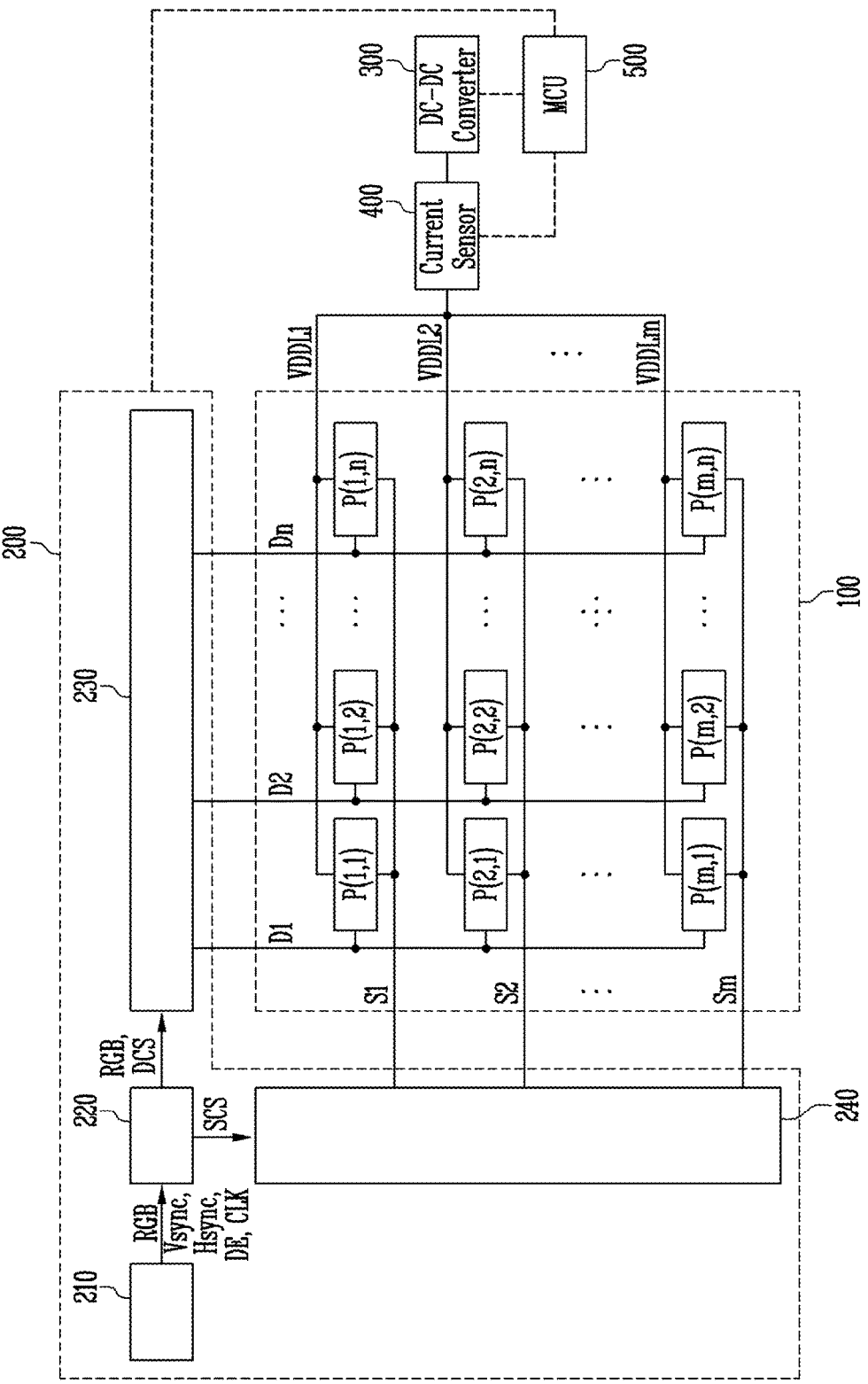
FIG. 1 is a diagram illustrating an organic light emitting display device according to an embodiment of the present invention.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate integrated circuit (IC) chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a diagram illustrating an organic light emitting display device according to an embodiment of the present invention. The organic light emitting display device may include a display panel 100, a display panel driver 200, a power supply (e.g., a direct current to direct current (DC-DC) converter) 300, a current sensor 400 and a microcontroller (e.g., an MCU) 500.

The display panel 100 may include pixels P(1, 1) to P(m, n), m and n being positive integers, may include power supply lines VDDL1 to VDDLm (hereinafter, simply "VDDL") for transferring power to the pixels (P(1, 1) to P(m, n) (hereinafter, simply "P"), and may include data lines D1 to Dn (hereinafter, simply "D") for transferring data voltages to the pixels P, and scan lines S1 to Sm (hereinafter, simply "S") for transferring scan signals to the pixels P. A pixel P(a, b) may be electrically connected to a scan line Sa, to a power supply line VDDLa, and to a data line Db, a being a positive integer less than or equal to n, and b being a positive integer less than or equal to m.

The display panel driver 200 may drive the display panel 100 by generating and supplying the data voltages to the data lines D, and by generating and supplying the scan signals to the scan lines S. The display panel driver 200 may include a host 210, a timing controller 220, a data driver 230, and a scan driver 240. The host 210, the timing controller 220, the data driver 230, and the scan driver 240 may be embodied as respective, individual electronic devices, or the entire display panel driver 200 may be embodied as a single electronic device, such as a display driver IC.

The host 210 may receive (e.g., from an external device) an electrical signal corresponding to a screen, or image, to be displayed, and may provide the electrical signal to the timing controller 220. The host 210 may convert image data, which may be input from an external video source device, into a data format with suitable resolution to be displayed on the display panel 100. The host 210 may supply a vertical synchronization signal Vsync, a horizontal synchronization signal Hsync, a data enable signal DE, a dot clock CLK, and/or image data RGB to the timing controller 220 through an interface, such as a low voltage differential signaling (LVDS) interface, or such as a transition minimized differential signaling (TMDS) interface.

The timing controller 220 may receive the timing signals Vsync, Hsync, DE, and CLK from the host 210, and may generate timing control signals to control operation timings of the data driver 230 and the scan driver 240. The timing control signals may include a scan timing control signal SCS to control the operation timing of the scan driver 240, and may include a data timing control signal DCS to control the operation timing and the data voltages of the data driver 230. The data timing control signal DCS may control a data sampling start timing of the data driver 230. In addition, the timing controller 220 may output the image data RGB to the data driver 230 so that the display panel 100 may display a corresponding image.

The data driver 230 may latch the image data RGB input from the timing controller 220 in response to the data timing control signal DCS. The data driver 230 may include a plurality of source drive ICs. The source drive ICs may be electrically connected to the data lines D of the display panel 100 by Chip-On-Glass (COG) or Tape Automated Bonding (TAB).

The scan driver 240 may sequentially apply a scan signal to the scan lines S in response to the scan timing control signal SCS. The scan driver 240 may be directly formed on a substrate of the display panel 100 by Gate In Panel (GIP), or may be electrically connected to the scan lines S of the display panel 100 by TAB.

The power supply 300 may generate power, and may supply the power to the power supply lines VDDL.

The current sensor 400 may measure a current level/current value of current corresponding to the power supplied to the display panel 100 from the power supply 300.

The microcontroller 500 may generate a panel signal including information about the display panel 100 on the basis of the measured current level of the power supplied to the display panel 100, and may transfer at least part of the generated panel signal to the display panel driver 200 and/or the power supply 300.

Figure 2:
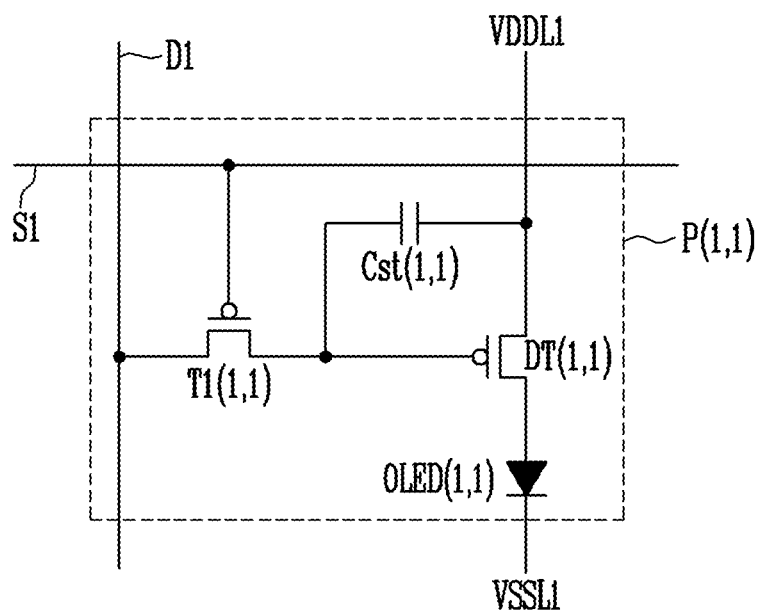
FIG. 2 is a diagram illustrating an embodiment of a structure of a pixel in a display panel shown in FIG. 1.

FIG. 2 is a diagram illustrating an embodiment of a structure of a pixel in a display panel shown in FIG. 1. For convenience of explanation, one embodiment of a pixel structure of a pixel P(1, 1) is described below.

The pixel P(1, 1) may be electrically connected to a scan line S1, to a power supply line VDDL1, and to a data line D1, and may include a first transistor T1(1, 1), a storage capacitor Cst(1, 1), a driving transistor DT(1, 1), and an organic light emitting diode OLED(1, 1). The storage capacitor Cst(1, 1) may be electrically connected between the power supply line VDDL1 and a gate electrode of the driving transistor DT(1, 1). An anode electrode of the organic light emitting diode OLED(1, 1) may be electrically connected to one of the electrodes (e.g., a drain electrode) of the driving transistor DT(1, 1), and a cathode electrode of the organic light emitting diode OLED(1, 1) may be electrically connected to another power supply line VSSL1. A voltage level of power supplied to the other power supply line VSSL1 may be lower than a voltage level of the power supplied to the power supply line VDDL1. The organic light emitting diode OLED(1, 1) may emit light due to the current flowing from the power supply line VDDL1 to the other power supply line VSSL1 through the driving transistor DT(1, 1).

When a scan signal is supplied to the scan line S1, the first transistor T1(1, 1) may be turned on, and the gate electrode of the driving transistor DT(1, 1) may be electrically connected to the data line D1. Therefore, a data voltage supplied to the data line D1 may also be supplied to the gate electrode of the driving transistor DT(1, 1). When the supply of the scan signal to the scan line S1 is terminated, the difference in voltage level between the gate electrode of the driving transistor DT(1, 1) and a source electrode of the driving transistor DT(1, 1) may be maintained by the storage capacitor Cst(1, 1). The current may be supplied from the power supply line VDDL1 to the organic light emitting diode OLED(1, 1). A level of the current being supplied may be based on the difference in the voltage level between the gate electrode and the source electrode of the driving transistor DT(1, 1). The organic light emitting diode OLED(1, 1) may emit light by using the supplied current, so that the emitted light may be displayed to a user.

Figure 3:
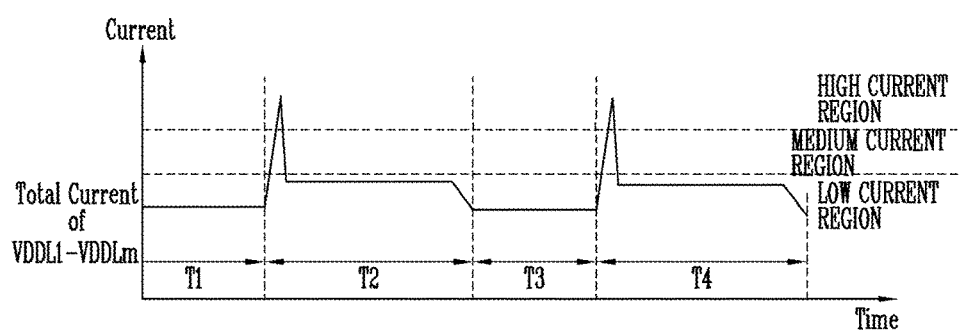
FIG. 3 illustrates a current level of power measured by a current sensor shown in FIG. 1 according to an embodiment of the present invention.

FIG. 3 illustrates a current level of power measured by the current sensor shown in FIG. 1 according to an embodiment of the present invention. The total current level of the power supplied to the power supply lines VDDL of the organic light emitting display device, which is driven by a simultaneous light emitting driving method, is described with reference to FIGS. 1 to 3.

A first period T1 and a third period T3 may be non-emitting periods, during which none of the pixels P emit light. Because the pixels P do not emit light, the total current level of the power supplied to the power supply lines VDDL may be very low. Therefore, the total current level of the power supplied to the power supply lines VDDL may be included in a low current region. The low current region may refer to a current level that is equal to or lower than a first reference current level (e.g., a current level of about 400 milliamps (mA) or less).

A second period T2 and a fourth period T4 may be light emitting periods, during which the pixels P emit light. Because the pixels P consume current and emit light, the total current level of the power supplied to the power supply lines VDDL may be greater than the total current level of the first period T1 and the third period T3. Particularly, immediately after the first period T1 and the third period T3 are terminated, a large amount of current may flow initially (e.g., a current surge may occur) due to the capacitor in each pixel P and due to parasitic capacitance. During at least part of the second period T2 and the fourth period T4, the total current level of the power supplied to the power supply lines VDDL may be included in a medium current region or in a high current region. The medium current region may refer to a current level that is equal to or greater than the first reference current level, and that is less than a second reference current level (for example, a current level of about 2 amperes (A)). The high current region may refer to a current level that is equal to or greater than the second reference current level.

Figure 4:
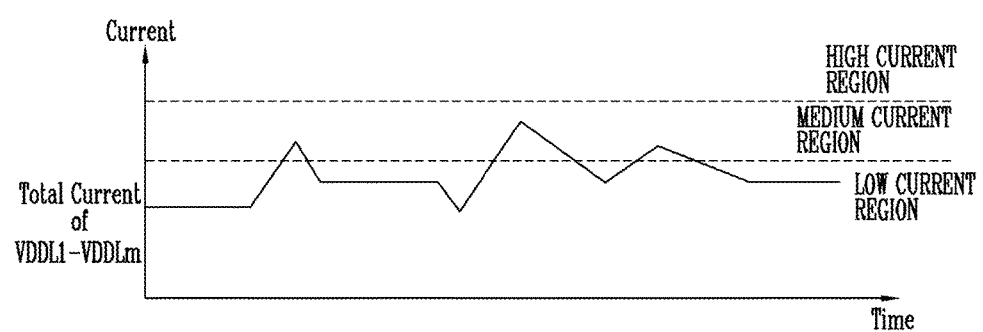
FIG. 4 illustrates a current level of power measured by a current sensor shown in FIG. 1 according to another embodiment of the present invention.

FIG. 4 illustrates a current level of power measured by the current sensor shown in FIG. 1 according to another embodiment of the present invention. The total current level of the power supplied to the power supply lines VDDL of the organic light emitting display device, which is driven by a sequential light emitting method, is described below with reference to FIGS. 1, 2 and 4.

According to the sequential light emitting method, a light emitting period during which the pixels P emit light at the same time, and a non-light emitting period during which none of the pixels P emit light, do not exist. However, a degree to which each pixel P emits light may be in proportion to the current supplied to each pixel. Therefore, if there is a change in an intensity of light being displayed, the total current level of the power supplied to the power supply lines VDDL may change. Because the total current level changes, the total current level of the power supplied to the power supply lines VDDL may be included in the low current region, in the medium current region, or in the high current region.

As described with reference to FIGS. 1 to 4, the total current level of the power transferred to the power supply lines VDDL may be measured by the current sensor 400. By using the measured current level of the power, deterioration of the panel may be measured or estimated. When only the total current level is measured by the current sensor 400, the current level of the power flowing through a portion of the display panel 100 may be measured by controlling data voltage levels of the data voltages transferred by the data lines D. Therefore, the entire display panel 100 may be divided into a plurality of regions, and a current level of the power flowing through each of the regions may be measured. A variation of the deterioration corresponding to each divided region of the display panel 100 may be measured. The current sensor 400 may measure a current level of the power supplied to the entire display panel 100, and may also measure a current level of a portion, or a divided region, of the display panel 100. The current sensor 400 may measure a current level of the power supplied to the display panel 100, which corresponds to the high current region, the medium current region, or the low current region.

When current flows through both ends of a predetermined resistor, a typical current sensor may measure a current level by dividing a difference in voltage level between both ends of the resistor (e.g., a voltage across the resistor) by a resistance level/resistance value of the resistor. When a resistor having a low resistance value/level is used, even when a current having a low current level flows, noise may greatly affect the process for measuring a voltage. Besides, even when the difference in voltage level is input to an analog-to-digital converter, it may be difficult for the analog-to-digital converter to closely distinguish the corresponding value. On the other hand, even when a current flows with a high current level, when a resistor having a high resistance level is used, a voltage across the resistor may be excessively high. In addition, when the resistance of the resistor is excessively large when compared to the flowing current, the resistor may be damaged. Therefore, when the high current region is measured, a current level may be measured by using a resistor having a relatively low resistance level. When the low current region is measured, a current level may be measured by using a resistor having a relatively high resistance level.

Therefore, the current sensor 400 may measure a resistance by using a resistor having a low resistance level when a high-level current flows, and may measure a resistance by using a resistor having a high resistance level when a low-level current flows. For example, a resistance level of a resistor used to measure the medium current region may be less than a resistance level of a resistor used to measure the low current region, and may be greater than a resistance level of a resistor used to measure the high current region. To change the resistance level of the resistor used for measurement, conventionally, a current level may be predicted, and a separate driving signal, which may have a logic value based on whether the predicted current level is greater than a reference level, may be generated. A current sensor may change the resistance level of the resistor, through which a current to be measured flows, on the basis of the driving signal. However, an additional circuit may be used to generate the driving signal, and the resistor may be damaged when the driving signal is operated in error.

Figure 5:
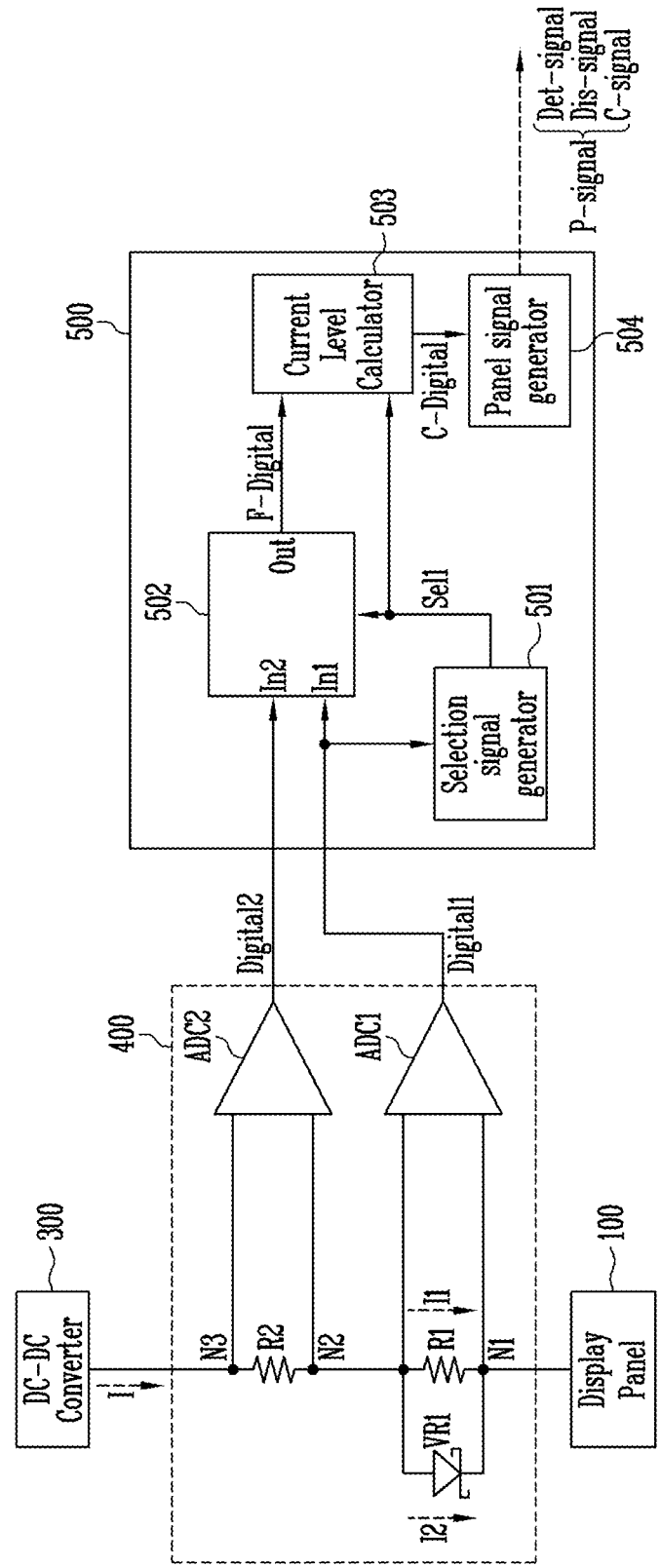
FIG. 5 is a diagram illustrating an embodiment of a current sensor and a microcontroller shown in FIG. 1.

FIG. 5 is a diagram illustrating an embodiment of the current sensor and the microcontroller shown in FIG. 1. The current sensor 400 and the microcontroller 500 are described below with reference to FIGS. 1 to 5.

The current sensor 400 may include a first resistor R1, a first voltage limiting device VR1, a second resistor R2, a first analog-to-digital converter ADC1, and a second analog-to-digital converter ADC2. The current sensor 400 may measure a current level of a current I flowing from a third node N3 to a first node N1. In FIG. 5, a current level of the current I flowing from the third node N3 to the first node N1 may correspond to that of the power supplied to the display panel 100 from the power supply 300.

The first resistor R1 and the first voltage limiting device VR1 may each be electrically connected between the first node N1 and a second node N2 (e.g., the first resistor R1 and the first voltage limiting device VR1 may be electrically coupled in parallel). The first voltage limiting device VR1 may include a Schottky diode, and a resistance level of the first resistor R1 may correspond to a value obtained by dividing a threshold voltage of the first voltage limiting device VR1 (e.g., about 0.4 V for convenience of explanation) by a first reference current level. When the first reference current is about 400 mA, the resistance level of the first resistor R1 may be about 1 ohm.

The second resistor R2 may be electrically connected between the second node N2 and the third node N3. A resistance level of the second resistor R2 may be lower/less than the resistance level of the first resistor R1, which may be about 1 ohm.

The first analog-to-digital converter ADC1 may be electrically connected between/to the first node N1 and the second node N2, and the second analog-to-digital converter ADC2 may be electrically connected between/to the second node N2 and the third node N3. That is, the first analog-to-digital converter ADC1 may have a first terminal that is electrically connected to the first node N1, and may have a second terminal that is electrically connected to the second node N2, and the second analog-to-digital converter ADC2 may have a first terminal that is electrically connected to the second node N2, and may have a second terminal that is electrically connected to the third node N3. The first analog-to-digital converter ADC1 may convert voltage across the first resistor R1 to output a first digital value Digital1, and the second analog-to-digital converter ADC2 may convert a voltage across the second resistor R2 to output a second digital value Digital2.

When a current having a current level corresponding to the low current region flows, a difference in voltage level between the first node N1 and the second node N2 may be less than the threshold voltage of the first voltage limiting device VR1. Therefore, because a level of a current I2 flowing through the first voltage limiting device VR1 is much less than a level of a current I1 flowing through the first resistor R1, the level of the current I2 may be essentially insignificant, and may be ignored. A first current path may be formed such that current I1 may flow from the second node N2 to the first node N1 through essentially only the first resistor R1, due to almost no current flowing through the first voltage limiting device VR1. Therefore, the current level of the current I may be measured from a value obtained by dividing the first digital value Digital1 by the resistance level of the first resistor R1. The current level of the current I may also be measured from a value obtained by dividing the second digital value Digital2 by the resistance level of the second resistor R2. However, noise may greatly affect measurement of the voltage across the second resistor R2, and it may be difficult for the second analog-to-digital converter ADC2 to closely distinguish differences in the voltage across the second resistor R2. Therefore, it may be more desirable to use the first digital value Digital1 and the resistance level of the first resistor R1 to determine the current level of the current I.

When a current having a current level corresponding to the medium current region or corresponding to the high current region flows, the difference in voltage level between the first node N1 and the second node N2 may be greater than or equal to the threshold voltage of the first voltage limiting device VR1. Therefore, because the level of the current I2 flowing through the first voltage limiting device VR1 is not much less than the level of the current I1 flowing through the first resistor R1, the level of the current I2 might not be ignored. A second current path may also be formed such that current I2 may flow from the second node N2 to the first node N1 through the first voltage limiting device VR1. Therefore, even when the level of the current I rises, the difference in voltage level between the first node N1 and the second node N2 may not be excessively increased by the first voltage limiting device VR1, so that the IR drop between the second node N2 and the first node N1 may not be high, and so that the risk of damage to the first resistor R1 may be reduced. However, because the level of the current I2 may be significant, the current I might not be measured from the value obtained by dividing the first digital value Digital1 by the resistance level of the first resistor R1. The current I may instead be measured from the value obtained by dividing the second digital value Digital2 by the resistance level of the second resistor R2.

The microcontroller 500 may include a selection signal generator 501, a selector 502, a current level calculator 503, and a panel signal generator 504.

The selection signal generator 501 may generate a first selection signal Sel1 on the basis of the first digital value Digital1 and a first reference level. The first reference level may be the threshold voltage of the first voltage limiting device VR1 (e.g., about 0.4 V). When the first digital value Digital1 is equal to or less than the first reference level, the level of the current I2 flowing through the first voltage limiting device VR1 may be much less than the level of the current I1 flowing through the first resistor R1. Thus, the level of the current I2 flowing through the first voltage limiting device VR1 may be ignored. As a result, the selection signal generator 501 may output the first selection signal Sel1 having a first logic value. When the first digital value Digital1 is greater than the first reference level, the level of the current I2 flowing through the first voltage limiting device VR1 may be not much less than the level of the current I1 flowing through the first resistor R1, and therefore might not be insignificant. Therefore, the selection signal generator 501 may output the first selection signal Sel1 having a second logic value that is different from the first logic value.

The selector 502 may include a first input terminal In1 for receiving the first digital value Digital1, a second input terminal In2 for receiving the second digital value Digital2, and an output terminal Out for outputting a final digital value F-Digital. The selector 502 may include a 2:1 multiplexer. The selector 502 may output the first digital value Digital1 as the final digital value F-Digital when the first selection signal Sel1 having the first logic value is received, and may output the second digital value Digital2 as the final digital value F-Digital when the first selection signal Sel1 having the second logic value is received.

The current level calculator 503 may output a current digital value C-Digital on the basis of the final digital value F-Digital and the first selection signal Sel1. More specifically, when the first selection signal Sel1 has the first logic value, the first digital value Digital1 may be output as the final digital value F-Digital. Therefore, the current level calculator 503 may output a value, which is obtained by dividing the final digital value F-Digital by the resistance level of the first resistor R1, as the current digital value C-Digital. When the first selection signal Sel1 has the second logic value, the second digital value Digital2 may be output as the final digital value F-Digital. Therefore, the current level calculator 503 may instead output a value, which is obtained by dividing the final digital value F-Digital by the resistance level of the second resistor R2, as the current digital value C-Digital. The microcontroller 500 may have the resistance level of the first resistor R1 and the resistance level of the second resistor R2 stored thereon.

The panel signal generator 504 may generate a panel signal P-signal on the basis of the current digital value C-Digital. The panel signal P-signal may include a deterioration signal Det-signal, a distribution signal Dis-signal, and a current level signal C-signal. The deterioration signal Det-signal may include information about deterioration of the entire display panel 100 from the information about the display panel 100. In the information about the display panel 100, the distribution signal Dis-signal may include information relating to distribution of deterioration of each divided region in the display panel 100. In the information about the display panel 100, the current level signal C-signal may include information about the current level of the power supplied to the display panel 100. In addition, the current level signal C-signal may also include information about which current region the current level of the power corresponds to (e.g., whether the current level of the power corresponds to the low current region, the medium current region, or the high current region).

The panel signal generator 504 may generate the deterioration signal Det-signal on the basis of the voltage level of the power supplied to the display panel 100 and the current digital value C-Digital. When the current is controlled to be supplied to only a portion of the display panel 100, the panel signal generator 504 may generate the distribution signal Dis-signal on the basis of the voltage level of the current supplied to the display panel 100, the current digital value C-Digital, and the information about the portion/region of the display panel 100 to which the current is supplied. The panel signal generator 504 may compare the current digital value C-Digital with the first and second reference current levels, and may determine which current region the current level of the power corresponds to (e.g., whether the current level of the power corresponds to the low current region, to the medium current region, or to the high current region). The current level signal C-signal may be generated by changing the format of the current digital value C-Digital.

In the embodiment illustrated in FIG. 5, the current level calculator 503 and the panel signal generator 504 may be separately provided. However, the present invention is not limited thereto. For example, in another embodiment, the panel signal generator 504 may calculate the current digital value C-Digital on the basis of the final digital value F-Digital and the first selection signal Sel1, and the current level calculator 503 may be omitted.

Figure 6:
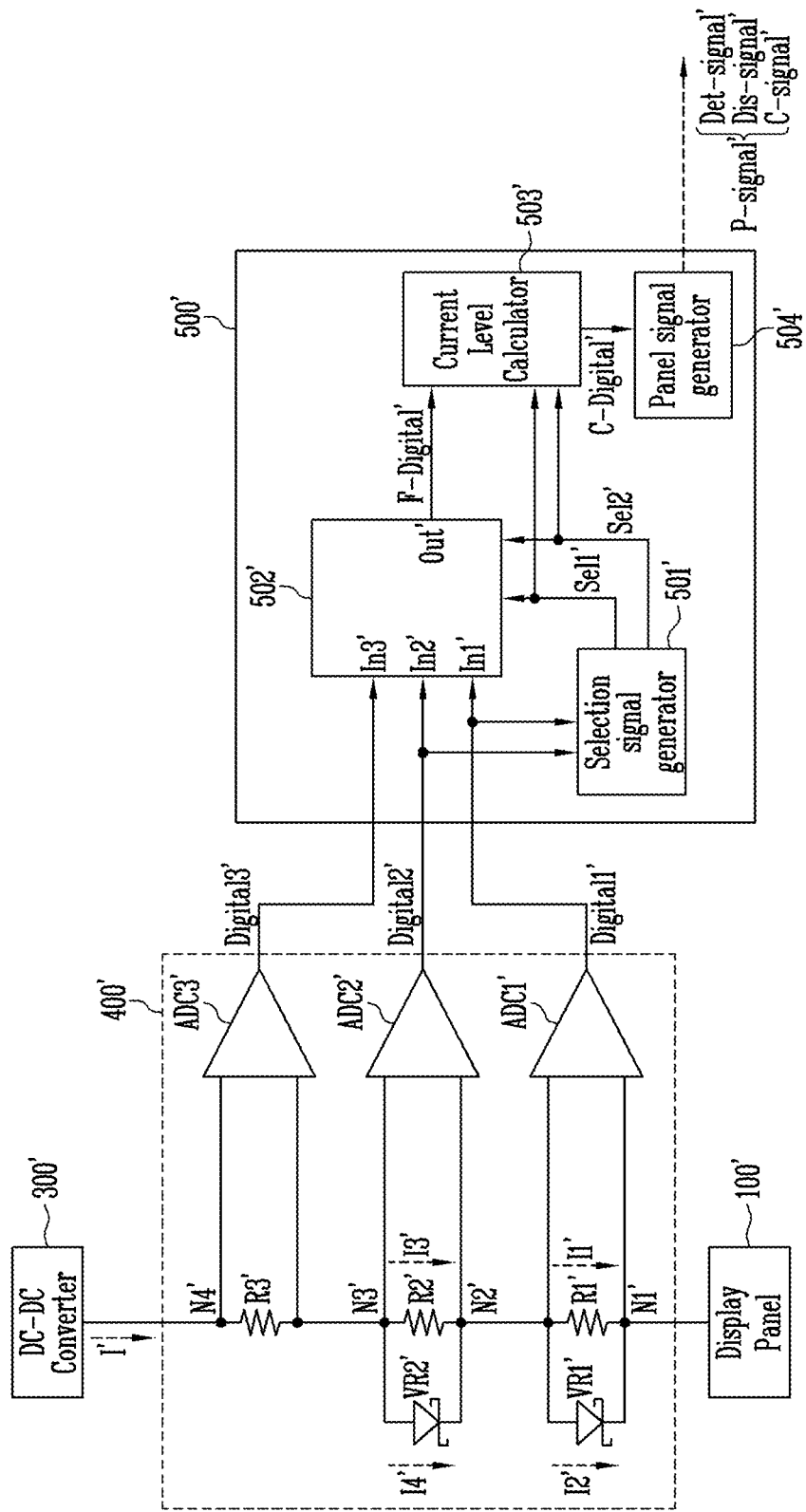
FIG. 6 is a diagram illustrating another embodiment of a current sensor and a microcontroller shown in FIG. 1.

FIG. 6 is a diagram illustrating another embodiment of the current sensor and the microcontroller shown in FIG. 1. A current sensor 400' and a microcontroller 500' are described below with reference to FIGS. 1 to 6.

As shown in FIG. 6, the current sensor 400' may include a first resistor R1', a first voltage limiting device VR1', a second resistor R2', a second voltage limiting device VR2', a third resistor R3', a first analog-to-digital converter ADC1', a second analog-to-digital converter ADC2', and a third analog-to-digital converter ADC3'. Because the first resistor R1', the first voltage limiting device VR1', the second resistor R2', the first analog-to-digital converter ADC1', and the second analog-to-digital converter ADC2' are the same as the first resistor R1, the first voltage limiting device VR1, the second resistor R2, the first analog-to-digital converter ADC1, and the second analog-to-digital converter ADC2, respectively, a detailed description thereof will be omitted. In FIG. 6, a current level of a current I' flowing from a fourth node N4' to a first node N1' may correspond to a current level of power supplied from a power supply 300' to a display panel 100'.

The second voltage limiting device VR2' may be electrically connected between a second node N2' and a third node N3'. The second voltage limiting device VR2' may also include a Schottky diode. A threshold voltage of the second voltage limiting device VR2' may be the same as, or different from, a threshold voltage of the first voltage limiting device VR1'. In addition, a resistance level of the second resistor R2' may correspond to a value obtained by dividing the threshold voltage of the second voltage limiting device VR2' (e.g., about 0.4 V for convenience of explanation) by the second reference current level. When the second reference current is about 2 amperes (A), the second resistor R2' may have the resistance level of about 200 milliohm.

The third resistor R3' may be electrically connected between the third node N3' and the fourth node N4'. A resistance level of the third resistor R3' may be lower than the resistance level second resistor R2', which is about 200 milliohm. For example, a resistance level of the third resistor R3' may be about 2 milliohm. The resistance level of the second resistor R2' may be less than a resistance level of the first resistor R1', and may be greater than the resistance level of the third resistor R3'.

The third analog-to-digital converter ADC3' may be electrically connected between the third node N3' and the fourth node N4' (e.g., the third analog-to-digital converter ADC3' may have a first terminal electrically connected to the third node N3', and may have a second terminal electrically connected to the fourth node N4'). The third analog-to-digital converter ADC3' may convert a voltage across the third resistor R3' to output a third digital value Digital3'.

As described above, when a current having a current level corresponding to the low current region flows, a current level of the current I' may be measured from a value obtained by dividing a first digital value Digital1' by the resistance level of the first resistor R1'.

When a current having a current level corresponding to the medium current region flows, the difference in voltage level between the first node N1' and the second node N2' may be greater than or equal to the threshold voltage of the first voltage limiting device VR1'. Therefore, the current I' might not be measured from the value obtained by dividing the first digital value Digital1' by the resistance level of the first resistor R1'. However, a difference in voltage level between the second node N2' and the third node N3' might be less than the threshold voltage of the second voltage limiting device VR2'. Therefore, because a level of a current I4' flowing through the second voltage limiting device VR2' is much lower/less than a level of a current I3' flowing through the second resistor R2', the level of the current I4' may be insignificant, or may be ignored. A third current path may be formed such that current I3' may flow from the third node N3' to the second node N2' through only the second resistor R2', due to the current through the second voltage limiting device VR2' being effectively zero. Therefore, the current level of the current I' may be measured from a value obtained by dividing a second digital value Digital2' by the resistance level of the second resistor R2'.

When a current having a current level corresponding to the high current region flows, the difference in voltage level between the second node N2' and the third node N3' may be greater than or equal to the threshold voltage of the second voltage limiting device VR2'. Because the level of the current I4' flowing through the second voltage limiting device VR2' might not be much less than a level of the current I3' flowing through the second resistor R2', the level of the current I4' might not be insignificant. A fourth current path may also be formed such that current may flow from the third node N3' to the second node N2' through the second voltage limiting device VR2'. Therefore, even when the level of the current I' increases, the difference in voltage level between the second node N2' and the third node N3' might not be excessively increased due to the presence of the second voltage limiting device VR2', so that the IR drop between the third node N3' and the second node N2' might not be high, and the risk of damage to the second resistor R2' may be reduced. Instead, because the level of the current I4' flowing through the second voltage limiting device VR2' is not much less than the level of the current I3' flowing through the second resistor R2', the level of the current I4' is not insignificant. Therefore, the current I' might not be measured from a value obtained by dividing the second digital value Digital2' by the resistance level of the second resistor R2'. The current I' may instead be measured from a value obtained by dividing the third digital value Digital3' by the resistance level of the third resistor R3'.

The microcontroller 500' may include a selection signal generator 501', a selector 502', a current level calculator 503', and a panel signal generator 504'.

The selection signal generator 501' may generate a first selection signal Sel1' on the basis of the first digital value Digital1' and a first reference level, and may generate a second selection signal Sel2' on the basis of a second digital value Digital2' and a second reference level. The first reference level may be a threshold voltage of the first voltage limiting device VR1' (e.g., about 0.4 V), and the second reference level may be a threshold voltage of the second voltage limiting device VR2' (e.g., about 0.4 V). Because the first selection signal Sel1' is generated on the basis of the first digital value Digital1' and the first reference level in the same manner that the first selection signal Sel1 is generated on the basis of the first digital value Digital1 and the first reference level, a detailed description thereof will be omitted.

When the second digital value Digital2' is equal to or less than the second reference level, the level of the current I4' flowing through the second voltage limiting device VR2' may be much less than the level of the current I3' flowing through the second resistor R2'. Thus, the level of the current I4' may be ignored. Therefore, the selection signal generator 501' may output the second selection signal Sel2' having a first logic value. When the second digital value Digital2' is greater than the second reference level, the level of the current I4' flowing through the second voltage limiting device VR2' might not be much less than the level of the current I3' flowing through the second resistor R2'. Thus, the level of the current I4' might not be insignificant. Therefore, the selection signal generator 501' may output the second selection signal Sel2' having a second logic value that is different from the first logic value.

The selector 502' may include a first input terminal In1' for receiving the first digital value Digital1', a second input terminal In2' for receiving the second digital value Digital2', a third input terminal In3' for receiving the third digital value Digital3', and an output terminal Out' for outputting the final digital value F-Digital'. The selector 502' may include a 3:1 multiplexer. The selector 502' may output the first digital value Digital1' as the final digital value F-Digital' when the selector 502' receives the first selection signal Sel1' having the first logic value, and receives the second selection signal Sel2' having the first logic value. The selector 502' may output the second digital value Digital2' as the final digital value F-Digital' when receiving the first selection signal Sel1' having the second logic value, and when receiving the second selection signal Sel2' having the first logic value. The selector 502' may output the third digital value Digital3' as the final digital value F-Digital' when receiving the second selection signal Sel2' having the second logic value.

The current level calculator 503' may output the current digital value C-Digital' on the basis of the final digital value F-Digital', the first selection signal Sel1', and the second selection signal Sel2'. More specifically, when each of the first selection signal Sel1' and the second selection signal Sel2' has the first logic value, then the first digital value Digital1' may be output as the final digital value F-Digital'. Therefore, the current level calculator 503' may output a value, which may be obtained by dividing the final digital value F-Digital' by the resistance level of the first resistor R1', as the current digital value C-Digital'. When the first selection signal Sel1' has the second logic value, and the second selection signal Sel2' has the first logic value, then the second digital value Digital2' may be output as the final digital value F-Digital'. Therefore, the current level calculator 503' may output a value, which may be obtained by dividing the final digital value F-Digital' by the resistance level of the second resistor R2', as the current digital value C-Digital'. When the second selection signal Sel2' has the second logic value, the third digital value Digital3' may be output as the final digital value F-Digital'. Therefore, the current level calculator 503' may output a value, which may be obtained by dividing the final digital value F-Digital' by the resistance level of the third resistor R3', as the current digital value C-Digital'. The resistance level of the first resistor R1', the resistance level of the second resistor R2', and the resistance level of the third resistor R3' may be previously stored in the microcontroller 500'.

Because the panel signal generator 504' of FIG. 6 is the same as the panel signal generator 504 of FIG. 5, a detailed description thereof may be omitted. The panel signal generator 504' may generate the panel signal P-signal' on the basis of the current digital value C-Digital'. The panel signal P-signal' may include a deterioration signal Det-signal', a distribution signal Dis-signal', and a current level signal C-signal'. Because the deterioration signal Det-signal', the distribution signal Dis-signal', and the current level signal C-signal' of FIG. 6 are the same as the deterioration signal Det-signal, the distribution signal Dis-signal, and the current level signal C-signal of FIG. 5, respectively, a detailed description thereof will be omitted.

Figure 7:
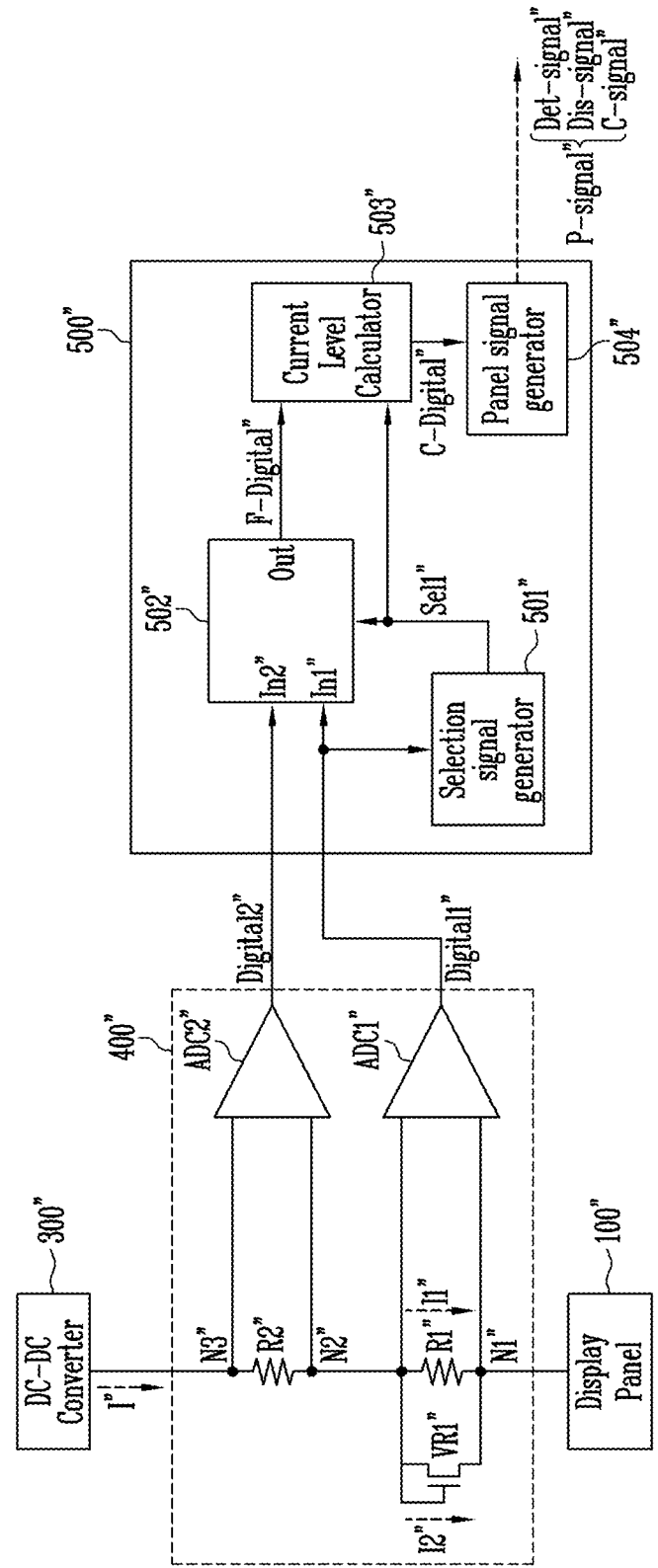
FIG. 7 is a diagram illustrating yet another embodiment of a current sensor and a microcontroller shown in FIG. 1.

FIG. 7 is a diagram illustrating another embodiment of a current sensor and a microcontroller shown in FIG. 1. A current sensor 400" and a microcontroller 500" will be described with reference to FIGS. 1 to 5 and 7.

The current sensor 400" may include a first resistor R1", a first a voltage limiting device VR1", a second resistor R2", a first analog-to-digital converter ADC1" and a second analog-to-digital converter ADC2".

Because the first resistor R1", the second resistor R2", the first analog-to-digital converter ADC1", and the second analog-to-digital converter ADC2" of FIG. 7 are the same as the first resistor R1, the second resistor R2, the first analog-to-digital converter ADC1, and the second analog-to-digital converter ADC2 of FIG. 5, respectively, a detailed description thereof will be omitted.

Unlike the first voltage limiting device VR1 of FIG. 5, the first voltage limiting device VR1" of FIG. 7 may include a diode-connected power transistor (e.g., a power field effect transistor (FET)). As compared to when a Schottky diode is used, a current flowing through the first voltage limiting device VR1" may have a high maximum level when including the diode-connected power FET. Instead, as compared to when a Schottky diode is used, a threshold voltage may be high. When the threshold voltage is high, the IR drop between a second node N2" and a first node N1" may be comparatively increased.

The microcontroller 500" may include a selection signal generator 501", a selector 502", a current level calculator 503", and a panel signal generator 504". Because the microcontroller 500" of FIG. 7 is the same as the microcontroller 500 of FIG. 5, a detailed description thereof will be omitted.

Figure 8:
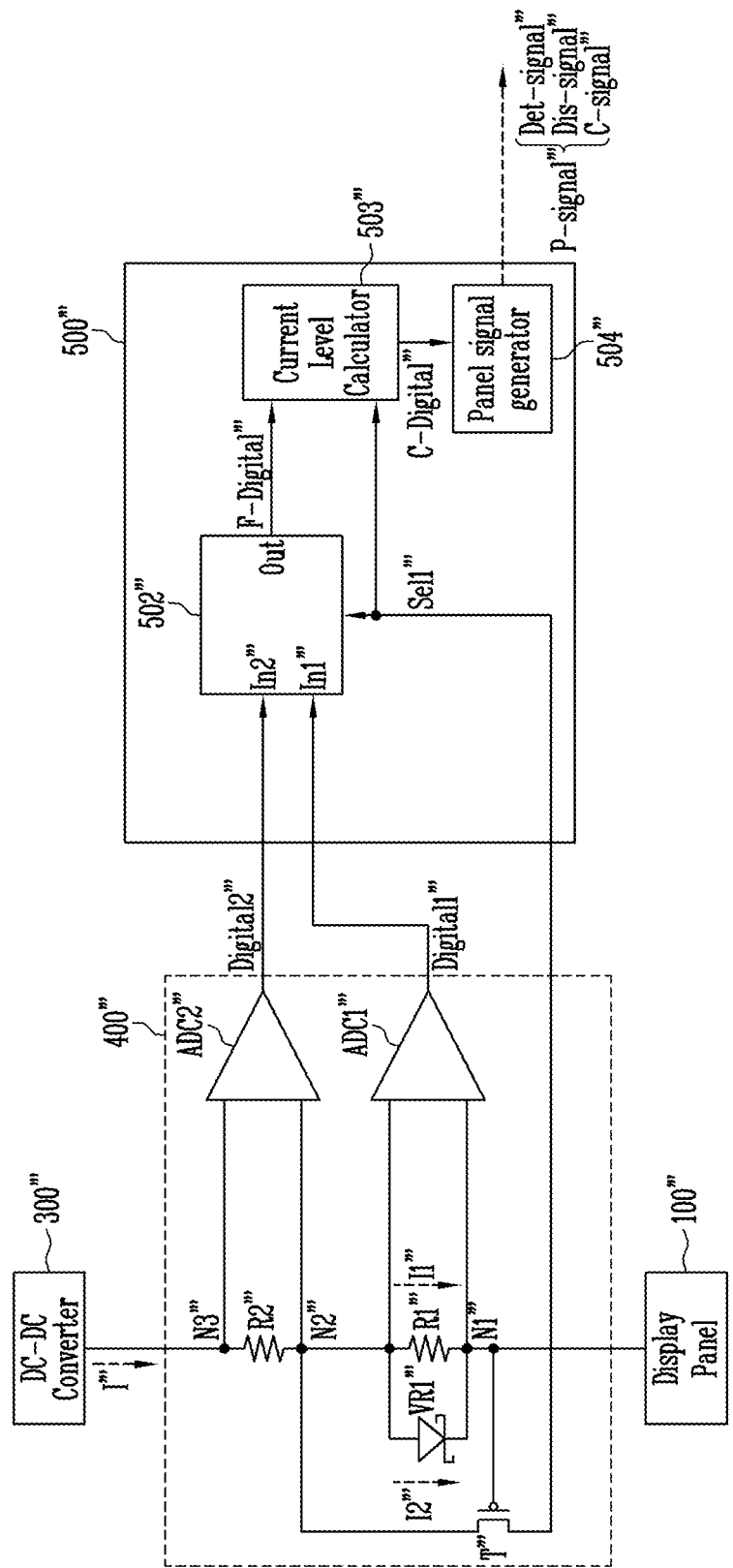
FIG. 8 is a diagram illustrating still another embodiment of a current sensor and a microcontroller shown in FIG. 1.

FIG. 8 is a diagram illustrating another embodiment of the current sensor and the microcontroller shown in FIG. 1. A current sensor 400''' and a microcontroller 500''' will be described with reference to FIGS. 1 to 5 and 8. Unlike in FIG. 5, a first selection signal Sel1''' may be output by the current sensor 400'''.

The current sensor 400''' may include a first resistor R1''', a first voltage limiting device VR1''', a second resistor R2''', a first analog-to-digital converter ADC1''', a second analog-to-digital converter ADC2''', and a transistor T'''. Because the first resistor R1''', the first voltage limiting device VR1''', the second resistor R2''', the first analog-to-digital converter ADC1''', and the second analog-to-digital converter ADC2''' of FIG. 8 are the same as the first resistor R1, the first voltage limiting device VR1, the second resistor R2, the first analog-to-digital converter ADC1, and the second analog-to-digital converter ADC2 of FIG. 5, respectively, a detailed description thereof will be omitted.

A difference in voltage level between a gate electrode and a source electrode of the transistor T''' may correspond to a voltage across the first resistor R1'''. In FIG. 8, the gate electrode of the transistor T''' may be electrically connected to a first node N1''', and the source electrode of the transistor T''' may be electrically connected to a second node N2'''. In the present embodiment, the difference in voltage level between the gate electrode and the source electrode of the transistor T''' corresponds to the difference in voltage level between both ends of the first resistor R1'''. When a voltage across the first resistor R1''' is less than a threshold voltage of the transistor T''', the current I2''' might not flow through the transistor T''', and the current sensor 400''' may output a first selection signal Sel1''' having a first logic value. When the voltage across the first resistor R1''' is greater than or equal to the threshold voltage of the transistor T''', the current I2''' may flow through the transistor T''', and the current sensor 400''' may output the first selection signal Sel1''' having a second logic value different from the first logic value.

The microcontroller 500''' may include a selector 502''', a current level calculator 503''', and a panel signal generator 504'''. Unlike in FIG. 5, the microcontroller 500''' might not generate the first selection signal Sel1'''.

Because the selector 502''', the current level calculator 503''', and the panel signal generator 504''' of FIG. 8 are very similar to the selector 502, the current level calculator 503, and the panel signal generator 504, of FIG. 5 respectively, a detailed description thereof will be omitted.

Because the first selection signal Sel1''' is generated by the current sensor 400'', and is not generated by the selection signal generator 501, the microcontroller 500''' may additionally include a voltage level converter for converting a voltage level of the first selection signal Sel1'''. The voltage level converter may convert and may provide the voltage level of the first selection signal Sel1''' to the selector 502''' and to the current level calculator 503".

According to an embodiment, a current sensor, which is capable of measuring a current level in a wide range, despite the omission of a separate driving signal having a logic value that is determined based on whether there is provided a predicted current level that is greater than a reference level, and an organic light emitting display device including the current sensor, are provided.

In addition, according to an embodiment, a reduced current sensor, which does not perform an erroneous operation because the reduced current sensor does not receive a driving signal, and which is therefore not damaged by the erroneous operation, and an organic light emitting display device including the current sensor, are provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims and their equivalents.

What is claimed is:

1. An organic light emitting display device comprising: a display panel comprising: pixels; power supply lines configured to transfer power to the pixels; data lines configured to transfer data voltages to the pixels; and scan lines configured to transfer scan signals to the pixels; a display panel driver configured to drive the display panel by generating and providing the data voltages to the data lines, and by generating and providing the scan signals to the scan lines; a power supply configured to generate and supply the power to the power supply lines; a current sensor configured to measure a current level of the power, the current sensor comprising: a first resistor between a first node a second node; a first voltage limiting device between the first node and the second node; a second resistor between the second node and a third node, and having a resistance level that is less than a resistance level of the first resistor; a first analog-to-digital converter that is configured to convert a voltage across the first resistor to output a first digital value; a second analog-to-digital converter that is configured to convert a voltage across the second resistor to output a second digital value; and a transistor; and a microcontroller comprising: a selector configured to output the first digital value or the second digital value as a final digital value based on a first selection signal; a current level calculator configured to output a current digital value based on the final digital value and the first selection signal; and a panel signal generator configured to generate a panel signal based on the current digital value, wherein the current sensor is configured to: output the first selection signal having a first logic value when a difference in voltage level between a gate electrode and a source electrode of the transistor is less than a threshold voltage of the transistor; and output the first selection signal having a second logic value that is different from the first logic value when the difference in voltage level between the gate electrode and the source electrode of the transistor is greater than or equal to the threshold voltage of the transistor, wherein the selector is configured to: output the first digital value as the final digital value when the first selection signal having the first logic value is received; and output the second digital value as the final digital value when the first selection signal having the second logic value is received, wherein the microcontroller is configured to: generate the panel signal comprising information about the display panel based on the current level of the power; generate the panel signal based on the voltage across the first resistor or the voltage across the second resistor; and transfer at least part of the panel signal to the display panel driver or the power supply, wherein a current flowing from the third node to the first node corresponds to the current level of the power and is configured to be measured based on a voltage across the first resistor or a voltage across the second resistor, and wherein a difference in voltage level between a gate electrode and a source electrode of the transistor corresponds to the voltage across the first resistor.

2. An organic light emitting display device comprising:
a display panel comprising:
  pixels;
  power supply lines configured to transfer power to the pixels;
  data lines configured to transfer data voltages to the pixels; and
  scan lines configured to transfer scan signals to the pixels;
a display panel driver configured to drive the display panel by generating and providing the data voltages to the data lines, and by generating and providing the scan signals to the scan lines;
a power supply configured to generate and supply the power to the power supply lines; and
a current sensor configured to measure a current level of the power, the current sensor comprising:
  a first resistor between a first node a second node;
  a first voltage limiting device between the first node and the second node;
  a second resistor between the second node and a third node, and having a resistance level that is less than a resistance level of the first resistor;
  a second voltage limiting device between the second node and the third node; and
  a third resistor between the third node and a fourth node, and having a resistance level that is less than the resistance level of the second resistor,
wherein a current flowing from the third node to the first node is configured to be measured based on a voltage across the first resistor or a voltage across the second resistor, and
wherein a current flowing from the fourth node to the first node is configured to be measured based on the voltage across the first resistor, the voltage across the second resistor, or a voltage across the third resistor.

3. The organic light emitting display device of claim 2, wherein the current flowing from the fourth node to the first node corresponds to the current level of the power, and
wherein the organic light emitting display device further comprises a microcontroller that is configured to:
  generate a panel signal comprising information about the display panel based on the current level of the power;
  generate the panel signal based on the voltage across the first resistor, the voltage across the second resistor, or the voltage across the third resistor; and
  transfer at least part of the panel signal to the display panel driver or the power supply.

4. The organic light emitting display device of claim 3, wherein the current sensor further comprises:
  a first analog-to-digital converter that is configured to convert the voltage across the first resistor to output a first digital value;
  a second analog-to-digital converter that is configured to convert the voltage across the second resistor to output a second digital value; and
  a third analog-to-digital converter that is configured to convert the voltage across the third resistor to output a third digital value, and
wherein the microcontroller comprises:
  a selection signal generator configured to output:
    a first selection signal based on the first digital value; and
    a second selection signal based on the second digital value;
  a selector configured to output one of the first, second, or third digital values as a final digital value based on logic values of the first selection signal and the second selection signal;
  a current level calculator configured to output a current digital value based on the final digital value, the first selection signal, or the second selection signal; and
  a panel signal generator configured to generate the panel signal based on the current digital value.

5. The organic light emitting display device of claim 4, wherein the selection signal generator is configured to:
  output the first selection signal having a first logic value when the first digital value is equal to or less than a first reference level;
  output the first selection signal having a second logic value that is different from the first logic value when the first digital value is greater than the first reference level;
  output the second selection signal having the first logic value when the second digital value is equal to or less than a second reference level; and
  output the second selection signal having the second logic value when the second digital value is greater than the second reference level, and wherein the selector is configured to output:
the first digital value as the final digital value when the first selection signal having the first logic value is received and the second selection signal having the first logic value is received;
the second digital value as the final digital value when the first selection signal having the second logic value is received and the second selection signal having the first logic value is received; and
the third digital value as the final digital value when receiving the second selection signal having the second logic value.

* * * * *